United States Patent [19]

Berenz et al.

[11] Patent Number: 4,537,654
[45] Date of Patent: Aug. 27, 1985

[54] TWO-GATE NON-COPLANAR FET WITH SELF-ALIGNED SOURCE

[75] Inventors: John J. Berenz, Lawndale; Kenichi Nakano, North Hollywood, both of Calif.

[73] Assignee: TRW Inc., Redondo Beach, Calif.

[21] Appl. No.: 560,075

[22] Filed: Dec. 9, 1983

[51] Int. Cl.³ .................. H01L 21/306; B44C 1/22; C03C 15/00; C23F 1/02
[52] U.S. Cl. ..................... 156/644; 29/571; 29/580; 148/187; 156/653; 156/657; 156/659.1; 156/662; 357/41; 427/88
[58] Field of Search ............ 156/644, 653, 657, 659.1, 156/662; 148/1.5, 187, 188; 29/571, 576 B, 580; 427/88, 91, 85; 430/313, 317; 357/22, 23, 41, 65

[56] References Cited

U.S. PATENT DOCUMENTS

| 4,141,021 | 2/1979 | Decker | 357/22 |
| 4,142,926 | 3/1979 | Morgan | 156/662 X |
| 4,180,422 | 12/1979 | Rosvold | 156/662 X |

Primary Examiner—William A. Powell
Attorney, Agent, or Firm—Robert M. Wallace; Noel F. Heal

[57] ABSTRACT

A two-gate non-coplanar field-effect transistor and a method for its fabrication. An active semiconductor layer is formed over a stop-etch layer on a substrate of semi-insulating material, such as gallium arsenide, and a via hole is formed from the opposite face of the substrate, through to the stop-etch layer. The via hole is metallized and located from the active-layer side of the device using an electron-beam technique. A two-element gate structure is then formed over the active layer, in approximate alignment with the via hole. Then a source region is ion-implanted into the active layer and into the stop-etch layer, using the positions of the gate elements to self-align the source. Drain contact regions are also formed in the active layer by ion implantation. Contact between the source region and the metallized via hole does not depend on accurate and uniform etching of the via hole. Instead, an opening is etched through the source region to the via hole, and filled with ohmic metal to make good contact with the via hole metallization.

15 Claims, 12 Drawing Figures

TWO-GATE NON-COPLANAR FET WITH SELF-ALIGNED SOURCE

CROSS-REFERENCE TO RELATED APPLICATION

This application is related to the subject matter of U.S. patent application Ser. No. 531,548, filed on Sept. 12, 1983 in the names of George W. McIver et al. entitled "Opposed Gate-Source Transistor and Method for its Fabrication," and assigned to the same assignee as this application.

BACKGROUND OF THE INVENTION

This invention relates generally to fabrication techniques for field-effect transistors, and more particularly, to the frabrication of non-coplanar field-effect transistors. There is a need to develop a millimeter-wave transistor for operation at frequencies of 40 gigahertz (GHz) and higher.

The technique proposed in the cross-referenced application was to etch a via hole through the substrate of device, and to align the source region of the device with the via hole using electron beam lithography (EBL) methods. This technique, which provides a generally satisfactory solution to the problem of aligning souce and gate regions in an opposed gate-source FET, suffers from one significant disadvantage. The etching of multiple via holes in a substrate wafer is hardly ever a uniform process, since the substrate thickness, etching rate, and other parameters may vary. Moreover, a rectangular via hole will typically be somewhat convex at the area of contact with the source region, like the cross section of a meniscus lens. Consequently, the incremental source resistance at the shorter ends of the meniscus will be higher than at the center, and there will be a longer transit time associated with these shorter end regions.

Accordingly, although these drawbacks can be avoided by appropriately customizing a single FET structure, it would be highly desirable to provide an improved technique in which the drawbacks were eliminated, and mass production of the devices thereby facilitated. This invention represents an alternative to the approach proposed in the cross-referenced application.

SUMMARY OF THE INVENTION

The present invention resides in a method, and resultant structure, for fabricating an opposed gate-source transistor using a self-aligned source technique. One of the most important steps of the method is the implanting of a source region defined by a split-gate structure having two parallel gate elements. A via hole is employed to make contact with the source region, but precise alignment between the via hole and the source region is not required, since ohmic metal is subsequently applied to a slot formed in the source region, to make good contact with metal coated on the via hole.

More specifically, the initial steps of the method are forming a semi-insulating stop-etch layer on a substrate, and then forming an active channel layer over the stop-etch layer. The next steps are forming a via hole through the substrate, up to the stop-etch layer, and metalizing the surface of the via hole. Using an electron beam lithography (EBL) machine, the position of the metallized via hole is determined from a back-scattered electron image, as viewed from the upper face of the substrate. Then gate metal is deposited on the active layer, there being two parallel gate elements centered over the via hole but not necessarily aligned with the via hole edges.

In the next step, a source region is formed in the active layer by ion implantation through a patterned mask defining an implantation window between the gate elements. This step is critical in implementing the self-aligned source structure of the invention. The source region formed between the parallel gate elements is aligned automatically with the gate, since the gate structure is used as a pattern for the formation of the source. During the same implantation step, drain areas can also be implanted into the active layer. In a subsequent implantation step, ions are also implanted into the stop-etch layer to form a source region contiguous with the implantation region in the active layer. Then, during an annealing step, ions in that part of the source region formed in the stop-etch layer diffuse laterally and define a source region that extends laterally beneath the edges of the gate elements.

Metallization is then re-applied to the surface of the via hole, since the metal has to be removed for the annealing step. At this stage, there may not necessarily be good contact between the implanted source region and the metallized via hole surface. Drain metal is next applied over the previously defined drain areas. In the next step, a central slot is formed in the source region, all the way through to the metallization on the via hole surface. Finally, ohmic metal is deposited in the slot to establish good contact with the via hole metal. In this way, the source region is electrically connected with the via hole metal, but there is no need for accurate alignment of the via hole and the source region.

The first implantation step, into the active layer, must not or a region that is in electrical contact with the gate elements. Therefore, it may be necessary to apply an additional masking layer to the gate structure prior to the implantation. One approach is to use a thin coating of metal, such as nickel, which extends beyond the gate metal and precludes the implantation from forming a region in contact with the gate elements. Alternatively, a photoresist layer applied to the gate metal prior to the implantation step may extend beyond the edges of the gate metal to preclude contact between the implanted region and the gate metal. Yet another possibility is that the edges of the gate elements may be etched away after the implantation step.

In the illustrative embodiment of the invention, the substrate is of gallium arsenide, the stop-etch layer is of gallium aluminum arsenide, and the active layer is of n-type gallium arsenide. The gate area is defined by first applying a silicon nitride layer, then a photoresist layer, then patterning the resist and the silicon nitride in the shape of the twin gate elements. After the resist is removed, gate metal such as titanium-tungsten, is deposited in the defined gate areas. Prior to the first implantation step, a resist layer is formed over the device again, and is patterned to open one window between the gate elements, for the source region, and two other windows over selected drain areas. After the first implantation step, which implants silicon ions in the exposed areas of the active layer, the resist layer is again removed, and replaced with another resist layer with a single window defining the source region between the two gate elements. In the second implantation step a deep n+ implant is made into the stop-etch layer, preferably using sulfur ions. These ions diffuse laterally in the subsequent annealing step and effectively foreshorten the gate length.

It will be appreciated from the foregoing that the present invention represents a significant advance in the field of field-effect transistors. In particular, the invention provides a technique for aligning a source region with a pair of opposed gate elements, and connecting the source region to a metallized via hole but without relying on the uniformity of the via hole for location and connection of the source region. Other aspects and advantages of the invention will become apparent from the following more detailed description, taken in conjunction with the accompanying drawings.

DESCRIPTION OF THE PREFERRED EMBODIMENT

Figure 1:
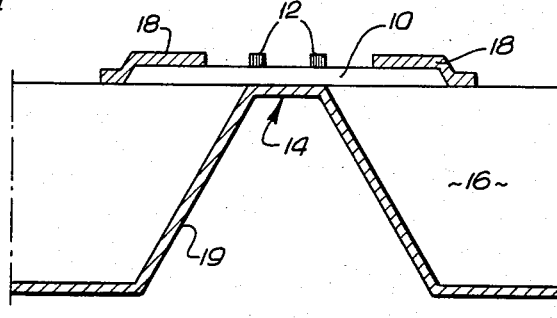
FIG. 1 is simplified cross-sectional view of a two-gate non-coplanar field-effect transistor.

As shown in the drawings for purposes of illustration, the present invention is concerned with a technique for fabricating a field-effect transistor (FET) having gate and source areas opposed in a non-coplanar configuration. Basically, in the opposed gate-source transistor a gate terminal and a source region are disposed on opposite faces of an active semiconductor layer. This is shown diagrammatically in FIG. 1, in which the active layer is indicated by reference numeral 10, the gate elements indicated at 12 and the source region at 14. The active layer is formed on a semi-insulating substrate 16, and drain contacts 18 are formed at opposite ends of the active layer. In the form of the opposed gate-source transistor that is illustrated, contact with the source region 14 is made by means of a metallized via hole 19 formed from beneath the substrate 16, i.e. from the face opposite the one on which the active layer is formed.

The split gate structure 12 is necessitated by the relatively long source region that the via hole provides. A single gate over a relatively long source region would have an excessively high gate-source capacitance. Unfortunately, there are difficulties in defining a source region in this way such that its size will be uniformly repeatable from device to device in a single substrate wafer. The length of the source region tends to vary along its width, which is measured in a direction perpendicular to the plane through which the cross-sectional view is taken. Moreover, the source length may vary from device to device because of variations in the thickness of the substrate.

In accordance with the present invention, a two-gate non-coplanar FET has its source connected with a metallized via hole, but the source region is formed from the same face of the active layer as the gates, and its characteristics are not dependent on the shape of the intersection between the via hole and the active layer. As will now be described in detail with reference to FIG. 2, the method of the invention employs a self-aligning source, the location of which is determined from the gate element positions, and not from the position of the via hole.

Figure 2A:
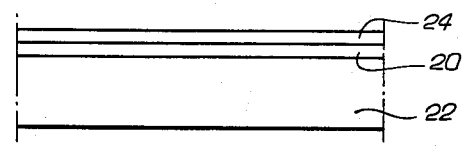
FIGS. 2a–2k are cross-sectional views illustrating a sequence of fabrication steps in accordance with the invention.
Figure 2B:
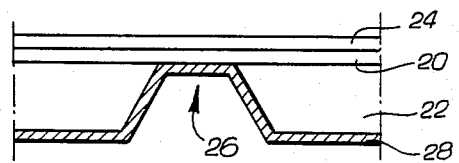

In the first step of the fabrication process, an undoped layer of gallium aluminun arsenide (GaAlAs) 20 is grown on a substrate 22 of gallium arsenide (GaAs), as shown in FIG. 2a. The undoped layer 20 is a stop-etch layer that will be subsequently used to control the depth of a via hole etching step. Then an n type active layer 24 of GaAs is grown over the stop-etch layer 20. In the next step, shown in FIG. 2b, a via hole 26 is etched into the substrate 22 from beneath, i.e. from the face of the substrate opposite from the one on which the layers 20 and 24 are formed. For convenience, the face in which the via hole is formed will be referred to as the lower face of the substrate, and the face on which the epitaxial layers 20 and 24 are formed will be referred to as the epitaxial face. The lower surface of the substrate 22, including the surface of the via hole 26, is then coated, by evaporation, with a metal layer 28. Preferably, the metal layer 28 includes a thin layer of titanium (Ti) and a relatively thick layer of gold (Au).

Figure 2C:
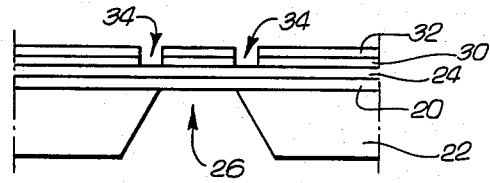

Next, as shown in FIG. 2c, a dielectric layer of silicon nitride ($Si_2N_4$) 30 is formed over the active layer 24, and a photoresist layer 32 is formed over the silicon nitride. In an electron beam lithography (EBL) machine, the location of the via hole 26 is determined from a backscattered electron image, and alignment marks (not shown) are defined on the epitaxial side of the device and are registered to the via hole. Then, the gate pattern 34 is formed in the layers 30 and 32 by means of a conventional dielectric-assisted photoresist liftoff technique. The split gate pattern 34 is centered over the exact via hole 26, but the gate elements are not necessarily in alignment with the edges of the via hole. At this point, the metallized layer 28 is removed to avoid damage in a subsequent annealing step.

Figure 2D:
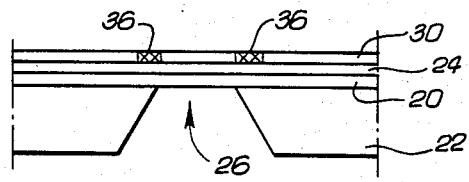

In the next step, shown in FIG. 2d, refractory gate metal, indicated at 36, is deposited in the gate pattern 34. The presently preferred gate metal is titanium-tungsten (TiW), which does not react with the GaAs material and is also stable under high-temperature annealing conditions.

Figure 2E:
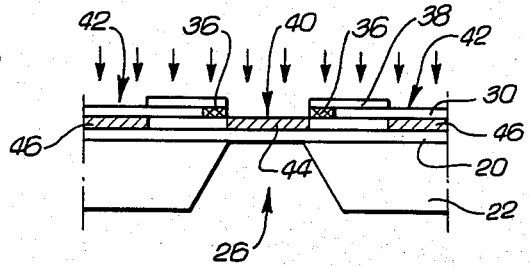
Figure 2F:
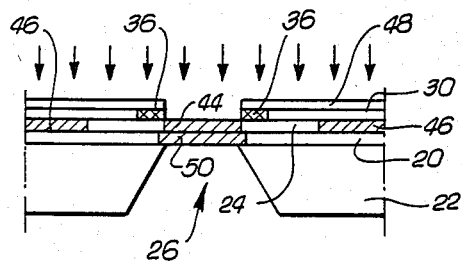
Figure 2G:
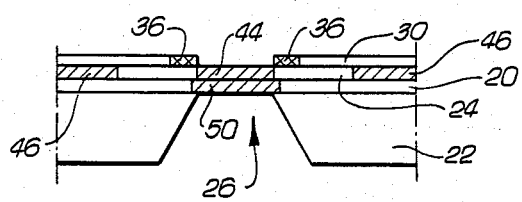

As shown in FIG. 2e, the next step is to apply another photoresist layer 38, and to pattern it to define a source area 40 and drain areas 42. Then, ion implantation of silicon ions is used to implant an n+ source contact region 44 in the active layer 24, and n+ contact regions 46 for the drain contacts. In the step shown in FIG. 2f, yet another photoresist layer 48 is applied, and a window is opened over the source region only. Then a second implantion step is performed, this time preferably with sulfur ions, to form a deep n+ implanted source region 50 in the GaAlAs stop-etch layer 20. Although this region 50 is shown as extending the full thickness of the step-etch layer 20, this is not a necessary requirement. In conjunction with this step, the silicon nitride layer 30 is etched away in the source area 40. During a subsequent annealing step, shown in FIG. 2g, the implanted ions in the source region 50 are diffused laterally to extend the region into an overlapping relationship with the gate metal 36.

The source contact region 44 in the active layer 24 must not, of course, make contact with the gate metal 36. To ensure this, the gate metal may include an additional top layer of another metal, such as nickel, which extends slightly into the source area 40, masking the ion implantation and ensures electrical separation of the gate metal 36 and the source contact region 44. Another approach is to window the last photoresist layer 48 to overlap the gate metal slightly. Yet another approach, but less desirable, is to etch the gate metal 36 away at its edges, after the implantation step. With this latter approach, care has to be taken not to encroach into the active layer 24.

Figure 2H:
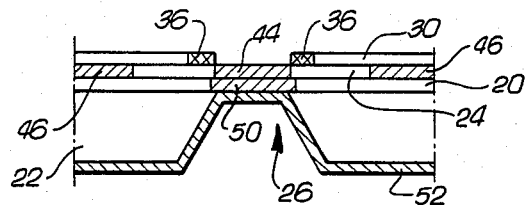

In the step shown in FIG. 2h, another metallized layer 52 of titanium and gold is evaporated onto the lower surface of the substrate 22, including the surface of the via hole 26. Because of variations in wafer thicknesses and etching rates, good contact with the source region is often impossible to achieve at this stage, but is not critical in the structure of the invention.

Figure 2I:
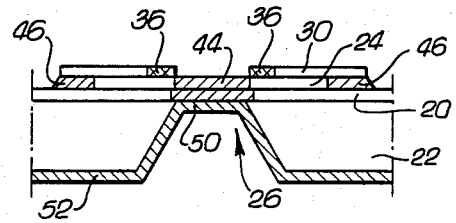
Figure 2J:
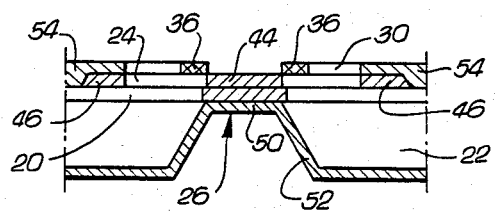

In the step shown in FIG. 2i, a transistor device is defined by etching the silicon nitride layer 30 and the active layer 24 to form a mesa around the device. Drain ohmic metal alloy, such as gold-germanium (Au-GE), shown at 54, is evaporated onto the drain contact regions 46.

Figure 2K:
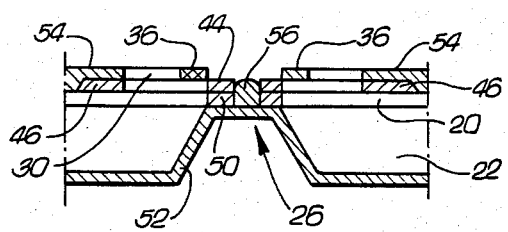

In the last step of the method, shown in FIG. 2k, the source area 40 has an opening etched in a central region, through the entire thicknesses of the source regions 44 and 50. Then ohmic metal, such as AuGe, indicated at 56, is evaporated into the etched opening in the source, to establish contact with the metal layer 52.

It will be appreciated from the foregoing that the invention represents a significant advance in the field of non-coplanar transistors. In particular, the invention provides for the accurate alignment of source and gates using a self-alignment technique. Good contact is still made between the source and the back plane of the device, but without concern for the accurate alignment of gates and metallized via holes. It will also be appreciated that, although a specific embodiment of the invention has been described in detail for purposes of illustration, various modifications may be made without departing from the spirit and scope of the invention. Accordingly, the invention is not to be limited except as by the appended claims.

We claim:

1. A method of fabricating a non-coplanar field-effect transistor, comprising the steps of:
    forming a stop-etch layer on a semiconductor substrate;
    forming an active semiconductive layer on the stop-etch layer;
    forming a metallized via hole in the substrate;
    locating the via hole from the active layer face of the device;
    forming a two-element gate on the active layer and centered in approximate alignment with the via hole;
    implanting a source region in the active layer and the stop-etch layer, in an area located between the gate elements;
    implanting drain contact regions in the active layer;
    etching an opening in the source region, to extend through to the metallized via hole; and
    depositing metal in the source region opening to establish good contact with the via hole metallization.

2. A method as set forth in claim 1, and further including the step of:
    annealing the implanted source region in the stop-etch layer, to diffuse ions laterally and ensure overlap of the source region and the gate elements.

3. A method as set forth in claim 1, wherein said step of implanting a source region includes:
    implanting ions into the active layer, in an area slightly shorter in length than the distance between the gate elements; and then
    implanting ions into the stop-etch layer.

4. A method as set forth in claim 3, and further including the step of:
    annealing the implanted source region in the stop-etch layer, to diffuse ions laterally and ensure partial overlap of the source region and the gate elements.

5. A method of fabricating a non-coplanar field-effect transistor, comprising the steps of:
    forming an active layer on a first face of a substrate;
    forming a metallized via hole from the second face of the substrate;
    forming two gate elements on the active layer in a substantially symmetrical relationship with the via hole;
    implanting two drain contact areas in the active layer;
    implanting a source region into the device between but not in contact with the gate elements;
    annealing the implanted source region to ensure that it partially overlaps the gate elements;
    forming an opening through the source region to the metallized via hole; and
    depositing metal in the opening to establish contact between the source region and the metallized via hole.

6. A method of fabricating a non-coplanar field-effect transistor, comprising the steps of:
    forming a stop-etch layer of semi-insulating gallium aluminum arsenide on one face of a semiconductor substrate of gallium arsenide;
    forming an active n+ semiconductive layer of gallium arsenide on the stop-etch layer;
    forming a via hole from the other face of the substrate;
    depositing a metal coating on the surface of the via hole;
    locating the via hole from the first or epitaxial side of the device;
    forming two gate elements on the active layer in approximate alignment with the via hole;
    implanting ions to form a source contact region in the active layer, in an area located between the gate elements;
    implanting ions to form drain contact regions in the active layer;
    implanting ions to form an n+ source region in the stop-etch layer and between the gate elements;
    etching an opening in the source region, extending through to the metallized via hole; and
    depositing metal in the source region opening to establish good contact with the via hole metallization.

7. A method as set forth in claim 6, wherein:
    said steps of implanting ions to form source and drain contact regions in the active layer employs silicon doping ions; and
    said step of implanting ions to form an n+ source region employs sulfur doping ions.

8. A method as set forth in claim 6, wherein:
    the metal used in coating the via hole and depositing metal in the source region opening in an alloy of gold and germanium.

9. A method as set forth in claim 6, wherein said step of forming gate elements includes:
    depositing a refractory metal in a predefined gate area.

10. A method as set forth in claim 9, wherein:
    the refractory metal is titanium-tungsten.

11. A method as set forth in claim 6, and further including the step of:

annealing after said step of implanting the source region in the stop-etch layer, to diffuse the implanted ions laterally and form an extended source region in overlapping relationship with the gate elements.

12. A method as set forth in claim 11, wherein:

said steps of implanting ions to form source and drain contact regions in the active layer employs silicon doping ions; and said step of implanting ions to form an n+ source region employs sulfur doping ions.

13. A method as set forth in claim 11, wherein:

the metal used in coating the via hole and depositing metal in the source region opening is an alloy of gold and germanium.

14. A method as set forth in claim 11, wherein said step of forming gate elements includes:

depositing a refractory metal in a predefined gate area.

15. A method of fabricating a non-coplanar field-effect transistor, comprising the steps of:

forming a stop-etch layer of semi-insulating gallium aluminum arsenide on one face of a semiconductor substrate of gallium arsenide;

forming an active n+ semiconductive layer of gallium arsenide on the stop-etch layer;

etching a via hole from the other face of the substrate;

depositing a coating of titanium-gold on the surface of the via hole;

locating the via hole from the first or epitaxial side of the device by electron beam techniques;

depositing a silicon nitride layer and a photoresist layer on the active layer;

patterning the silicon nitride and photoresist layers to define a two-element gate;

forming two gate elements of titanium-tungsten on the active layer in approximate alignment with the via hole;

removing the titanium coating on the surface of the via hole;

forming a patterned photoresist layer over the active layer to define a source window between the gate elements and two drain windows;

implanting silicon ions through the windows in the photoresist layer to form a source contact region in the active layer, in an area located between the gate elements and drain contact regions in the active layer;

forming another patterned photoresist layer over the active layer to define a source window only;

implanting sulfur ions to form an n+ source region in the stop-etch layer and between the gate elements;

annealing the structure after the foregoing implanting step, to diffuse some of the sulfur ions laterally in the stop-etch layer, to form an extended source region in partial overlapping relationship with the gate elements;

etching an opening in the source region, extending through to the metallized via hole;

depositing ohmic gold-germanium metal in the source region opening to establish good contact with the via hole metallization; and forming metal drain contacts over the drain contact regions.

* * * * *

UNITED STATES PATENT AND TRADEMARK OFFICE
CERTIFICATE OF CORRECTION

PATENT NO. : 4,537,654

DATED : August 27, 1985

INVENTOR(S) : John J. Berenz & Kenichi Nakano

It is certified that error appears in the above-identified patent and that said Letters Patent is hereby corrected as shown below:

Column 1, line 3 (after the title), insert --This invention was made with Government support under contract No. N00123-81-C-1225 awarded by the Naval Ocean Systems Center. The Government has certain rights in this invention.--;

Column 1, line 7, delete the second 1983;

Column 1, line 22, delete "souce" and insert --source--.

Column 2, line 37, delete "or" and insert --form--.

Signed and Sealed this

Twenty-seventh Day of January, 1987

Attest:

DONALD J. QUIGG

Attesting Officer

Commissioner of Patents and Trademarks